United States Patent
Lacaze et al.

(10) Patent No.: US 10,565,333 B2
(45) Date of Patent: Feb. 18, 2020

(54) STRUCTURAL ANALYSIS FOR ADDITIVE MANUFACTURING

(71) Applicants: Alberto Daniel Lacaze, Potomac, MD (US); Karl Nicholas Murphy, Rockville, MD (US)

(72) Inventors: Alberto Daniel Lacaze, Potomac, MD (US); Karl Nicholas Murphy, Rockville, MD (US)

( * ) Notice: Subject to any disclaimer, the term of this patent is extended or adjusted under 35 U.S.C. 154(b) by 543 days.

(21) Appl. No.: 14/695,257

(22) Filed: Apr. 24, 2015

(65) Prior Publication Data
US 2015/0310148 A1    Oct. 29, 2015

Related U.S. Application Data

(60) Provisional application No. 61/984,536, filed on Apr. 25, 2014.

(51) Int. Cl.
*G06F 17/50* (2006.01)

(52) U.S. Cl.
CPC .................. *G06F 17/5018* (2013.01)

(58) Field of Classification Search
CPC . Y02P 10/29; C04B 2235/6026; B33Y 10/00; G06F 17/5018
See application file for complete search history.

(56) References Cited

U.S. PATENT DOCUMENTS

| | | | |
|---|---|---|---|
| 2005/0060130 A1* | 3/2005 | Shapiro ............... | G06F 17/5018 703/2 |
| 2007/0118243 A1* | 5/2007 | Schroeder ............ | B33Y 50/00 700/118 |
| 2014/0039659 A1* | 2/2014 | Boyer ................. | B29C 67/0051 700/98 |
| 2014/0277669 A1* | 9/2014 | Nardi .................. | G05B 19/042 700/103 |
| 2015/0021830 A1* | 1/2015 | Yerazunis ........... | B29C 67/0055 264/401 |

(Continued)

OTHER PUBLICATIONS

Bellehumeur, et al. "Modeling of Bond Formation Between Polymer Filaments in the Fused Deposition Modeling Process." Journal of Manufacturing Processes, vol. 6, No. 2 (2004), pp. 170-178 [retrieved on Jul. 19, 2017]. Retrieved from <http://www.sciencedirect.com/science/article/pii/S1526612504700717>.*

(Continued)

*Primary Examiner* — Rehana Perveen
*Assistant Examiner* — Alfred H B Wechselberger
(74) *Attorney, Agent, or Firm* — Radha Narayanan

(57) ABSTRACT

The system described assumes that the physical properties of the bind sites will be sufficiently repeatable to be tabulated based on a limited set of control constraints: filament material, temperature of the print head, feed rate, temperature of the substrate, and filament orientations at the bind site, etc. The main idea of this system is to utilize the bind sites and the connection and directionality of the threads as a lattice that can then be fed into a finite element analysis (FEA) algorithm for simulation in order to extract the macro physical properties of the part being produced. These repeatable bind site tabulated values can then be used to provide the cell properties for the FEA. The micro properties of the bind site can also be encoded into explicit equations, neural networks or other approximators.

18 Claims, 2 Drawing Sheets

(56) References Cited

U.S. PATENT DOCUMENTS

2016/0321384 A1* 11/2016 Pal ..................... G06F 17/5018

OTHER PUBLICATIONS

Novakova-Marcincinova et al. "Testing of Materials for Rapid Prototyping Fused Deposition Modelling Technology." International Scholarly and Scientific Research and Innovation, vol. 6, No. 10 (2012) [retrieved on Jul. 19, 2017]. Retrieved from <http://www.waset.org/publications/1347>.*

Deffenbaugh, et al. "Fully 3D Printed 2.4 GHz Bluetooth/Wi-Fi Antenna." International Symposium on Microelectronics, vol. 2013, No. 1 [retrieved on Jul. 20, 2017]. Retrieved from STIC.*

Li et al. "Composite Modeling and Analysis for Fabrication of FDM Prototypes with Locally Controlled Properties." Journal of Manufacturing Processes, vol. 4, No. 2 (2002) [retrieved on Jul. 19, 2017]. Retrieved from <http://ac.els-cdn.com/S1526612502701394/1-s2.0-S1526612502701394-main.pdf>.*

Frazier, W. "Metal Additive Manufacturing: A Review." Journal of Materials Engineering and Performance, vol. 23, No. 6 (Published Online Apr. 8, 2014) [retreived on Jul. 19, 2017]. Retrieved from <https://link.springer.com/content/pdf/10.1007%2Fs11665-014-0958-z.pdf>.*

Umetani, et al. "Cross-sectional Structural Analysis for 3D Printing Optimization." SIGGRAPH Asia Technical Briefs (2013) [retreived on Jul. 19, 2017]. Retrieved from <https://pdfs.semanticscholar.org/f68c/aa0602d6ce2c3755f7df09569904eb2218eb.pdf>.*

Fluitt, D. "Feasibility Study Into the Use of 3D Printed Materials in Cubesat Flight Missions." [thesis] California Polytechnic State University, San Luis Obispo: Space Technology Lab (2012) [retrieved on Jul. 19, 2017]. Retrieved from <http://digitalcommons.calpoly.edu/cgi/viewcontent.cgi?article=1851&context=theses>.*

Sood et al. "Parametrics appraisal of mechanical property of fused deposition modelling processed parts." Materials and Design, vol. 31 (2010), pp. 287-295 [retrieved on Jul. 19, 2017]. Retrieved from <http://ac.els-cdn.com/S0261306909002945/1-s2.0-S0261306909002945-main.pdf?_tid=98a5c25e-6d9f-11e7-a6d7-00000aab0f27&acdnat=1500591968_03e13eb85be7b6d>.*

Rodriguez, et al. "Mechanical behavior of acrylonitril butadiene styrene fused deposition materials modeling." Rapid Prototyping Journal, vol. 9, No. 4 (2003), doi: 10.1108/13552540310489604 [retrieved on Jul. 19, 2017]. Retrieved from <http://www.ewp.rpi.edu/hartford/~sayrer/Master's%20Project/other/Research/Mechanical%20behavior%20of%20acrylonitri>.*

Roberts et al. "A three-dimensional finite element analysis of the temperature field during laser melting of metal powders in additive layer manufacturing." International Journal of Machine Tools and Manufacture, vol. 29 (2009) [retrieved on Jul. 20, 2017]. Retrieved from <http://ac.els-cdn.com/S0890695509001400/1-s2.0-S0890695509001400-main.pdf>.*

Bugeda et al. "Numerical prediction of temperature . . . " Rapid Prototyping Journ, vol. 5, Iss 1, pp. 21-26 [retrieved on May 20, 2019]. Retrieved from <https://www.researchgate.net/publication/234126921_Numerical_prediction_of_temperature_and_density_distributions_in_selective_laser_sintering_processes> (Year: 1999).*

Sood et al. "Experimental investigation and empirical modelling of FDM process for compressive strength improvement" Journal of Advanced Research, vol. 3, pp. 81-90 [retrieved on May 20, 2019]. Retrieved from <https://www.sciencedirect.com/science/article/pii/S209012321100066X> (Year: 2012).*

Labeas et al. "Investigation on the Static Response and Failure Process of Metallic Open Lattice Cellular Structures" Strain, vol. 46, pp. 195-204 [retrieved on May 20, 2019]. Retrieved from <https://onlinelibrary.wiley.com/doi/abs/10.1111/j.1475-1305.2008.00498.x> (Year: 2008).*

* cited by examiner

STRUCTURAL ANALYSIS FOR ADDITIVE MANUFACTURING

CROSS REFERENCE TO RELATED APPLICATIONS

This application claims priority from U.S. Provisional Patent Application Ser. No. 61/984,536, entitled "Structural Analysis for Additive Manufacturing", filed on 25 Apr. 2014. The benefit under 35 USC § 119e of the United States provisional application is hereby claimed, and the aforementioned application is hereby incorporated herein by reference.

TECHNICAL FIELD OF THE INVENTION

The present invention relates generally to additive manufacturing. More specifically, the present invention relates to incorporating a finite element analysis (FEA) algorithm for simulation in order to extract the macro physical properties of the part being produced.

BACKGROUND OF THE INVENTION

Additive manufacturing (AM) is quickly migrating from a niche technology for rapid prototyping into a bona fide manufacturing process for a variety of applications. One of the main deficiencies preventing AM from being broadly adopted is the lack of tools capable of simulating the physical properties of the printed part. When a single CAD model is printed with different printers, fill patterns, or even print orientation (e.g. part printed upright, upside-down, on its side), the resulting printed part will have significantly different physical properties (e.g. material density, stress/strain properties). In the state of the art, designers print the part in different orientations and different fill patterns and then test the outcomes until the desired specifications are achieved. This is a time consuming process that could be significantly improved if a simple mechanism for predicting these physical properties were available.

All additive manufacturing processes generate bind sites that create a physical lattice. The bind sites are created where the material from one layer gets melted or welded into the material of the previous layer. In the case of metal manufacturing the bind sites are created either by direct heat or laser sintering of the metal powder or the coating of the metal powder. In the case of polymer printing the bind sites connect the filaments of one layer to the next.

DEFINITIONS

Unless stated to the contrary, for the purposes of the present disclosure, the following terms shall have the following definitions:

"AM" is an abbreviation for additive manufacturing or the additive manufacturing processes.

"Electronic Mobile Device" is defined as any computer, phone, smartphone, tablet, or computing device that is comprised of a battery, display, circuit board, and processor that is capable of processing or executing software. Examples of electronic mobile devices are smartphones, laptop computers, and table PCs.

"FEA" is an abbreviation for finite element analysis.

A "mobile device" is a generic term used to refer to a variety of devices that allow people to access data and information from where ever they are. This includes cell phones and other portable devices such as, but not limited to, PDAs, Pads, smartphones, and laptop computers.

A "User" is any person registered to use the computer system executing the method of the present invention.

SUMMARY OF THE INVENTION

The system described assumes that the physical properties of the bind sites will be sufficiently repeatable to be tabulated based on a limited set of control constraints: filament material, temperature of the print head, feed rate, temperature of the substrate, and filament orientations at the bind site, etc. The main idea of this system is to utilize the bind sites and the connection and directionality of the threads of a physical lattice that can then be used to create a corresponding finite element analysis (FEA) lattice for simulation in order to extract the macro physical properties of the part being produced. These repeatable bind site tabulated values can then be used to provide the cell properties for the FEA. The micro properties of the bind site can also be encoded into explicit equations, neural networks or other approximators. Likewise, the FEA lattice is the name for the numerical representation of the physical lattice, including bind sites, and can exist regardless if a FEA is used or some other method.

BRIEF DESCRIPTION OF THE DRAWINGS

The accompanying drawings, which are incorporated herein a form a part of the specification, illustrate the present invention and, together with the description, further serve to explain the principles of the invention and to enable a person skilled in the pertinent art to make and use the invention.

DETAILED DESCRIPTION OF THE INVENTION

Figure 1:
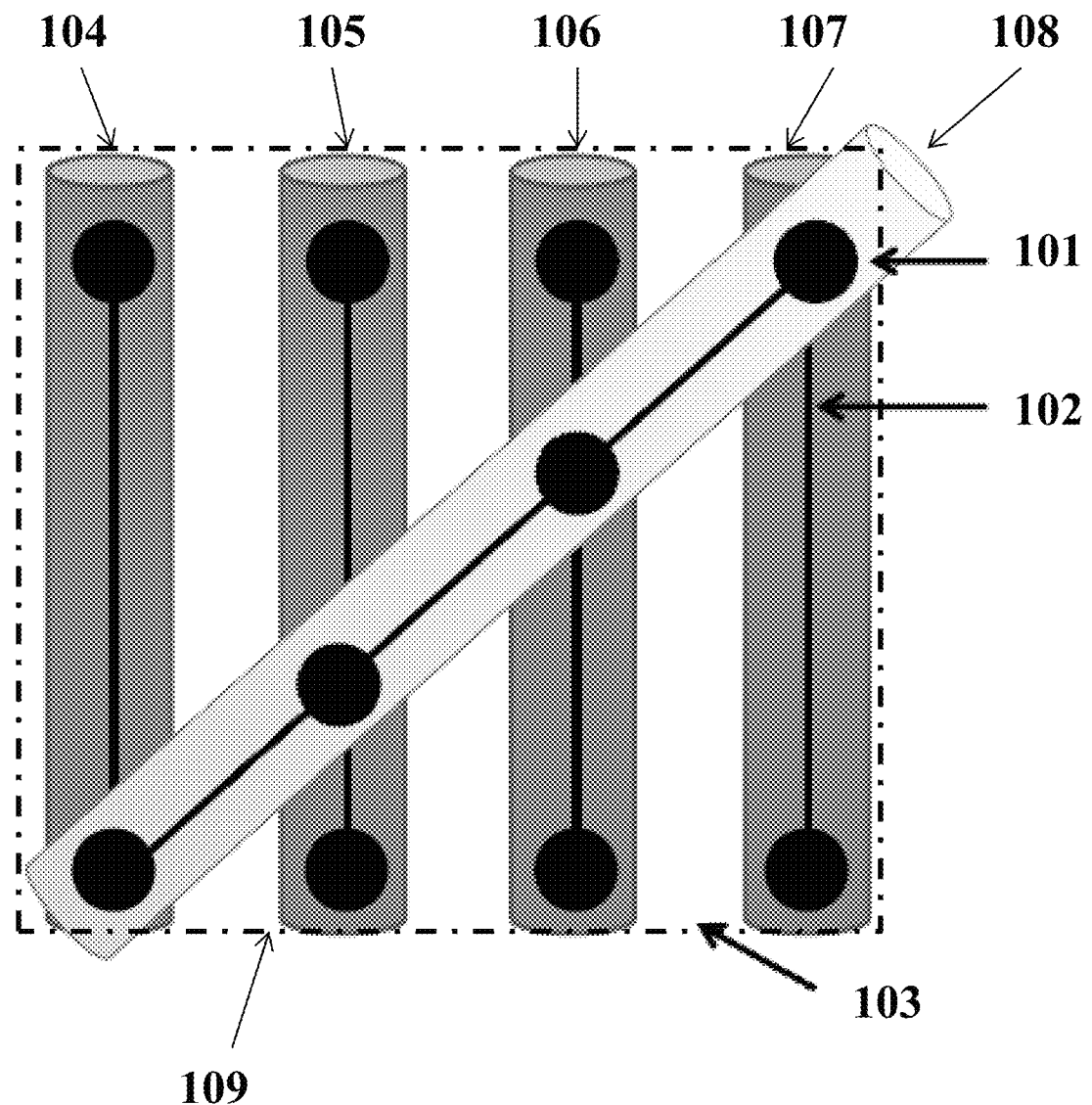
FIG. 1 illustrates where the filaments on the first layer (dark color) and the filaments in the top layer (light color) as well as the bind sites when the top layer melts onto the first layer to create a physical lattice.

In the following detailed description of the invention of exemplary embodiments of the invention, reference is made to the accompanying drawings (where like numbers represent like elements), which form a part hereof, and in which is shown by way of illustration specific exemplary embodiments in which the invention may be practiced. These embodiments are described in sufficient detail to enable those skilled in the art to practice the invention, but other embodiments may be utilized and logical, mechanical, electrical, and other changes may be made without departing from the scope of the present invention. The following detailed description is, therefore, not to be taken in a limiting sense, and the scope of the present invention is defined only by the appended claims.

In the following description, numerous specific details are set forth to provide a thorough understanding of the invention. However, it is understood that the invention may be practiced without these specific details. In other instances, well-known structures and techniques known to one of ordinary skill in the art have not been shown in detail in order not to obscure the invention. Referring to the figures, it is possible to see the various major elements constituting the apparatus of the present invention.

Many polymer printers create their parts by depositing molten filaments of the polymers. These threads of polymer bind to threads on the current later, layer underneath, and layer above. The properties of these binding sites depend on the properties of the material being used; temperature of the thread being deposited; the temperature of the surrounding layers; as well as the direction of each thread.

The macro properties of the part are determined by the micro properties of the thread being deposited and the location and properties of the bind sites 101. This is also true for other AM processes that do not have bind sites 101 created by the touching of the filaments, but instead have discrete melting points created by other means, such as a laser in the case of laser sintering. These discrete number of sites and the discrete number of layers are inherent to the AM process that enables the system being described.

In other additive manufacturing mechanisms where filaments are not used (like many of the metal 3D printers), the physical lattice 102 is still generated by a laser or some other device that melts the metal particles or the casing of the metal particles. In these cases there are no filaments, therefore the properties of the binding site and the properties of the material before and after annealing process are used.

The print pattern used to manufacture the part is determined by algorithms that are usually proprietary to the printer. However, most printers allow you to change the patterns to adjust fill density. During this step in the design process, a solid part is submitted to this pattern generation algorithm that computes a trajectory for the print head which will ultimately determine how the filaments are laid and, therefore, the location of the bind sites 101. In the case of laser sintering, the pattern generation algorithm determines the areas where the laser will be used to bind the substrate. In both cases, these sites are discrete, and countable.

The system described assumes that the physical properties of the bind sites 101 will be sufficiently repeatable to be tabulated based on a limited set of control constraints: filament material, temperature of the print head, feed rate, temperature of the substrate, and filament orientations at the bind site, etc. The main idea of this system is to utilize the properties of the bind sites 101 and the connection and directionality of the physical lattice 102 that can be represented as a finite element analysis (FEA) lattice 102 for simulation in order to extract the macro physical properties of the part being produced. These repeatable bind site tabulated values can then be used to provide the cell properties for the FEA. The micro properties of the bind site can also be encoded into explicit equations, neural networks or other approximators. FIG. 1 shows one such example. In this case, the filaments of the first layer 104-107, the filaments of the top layer 108, and the bind sites 101 are used to create the FEA lattice 109 that will be used for predicting the macro physical properties of the part.

Figure 2:
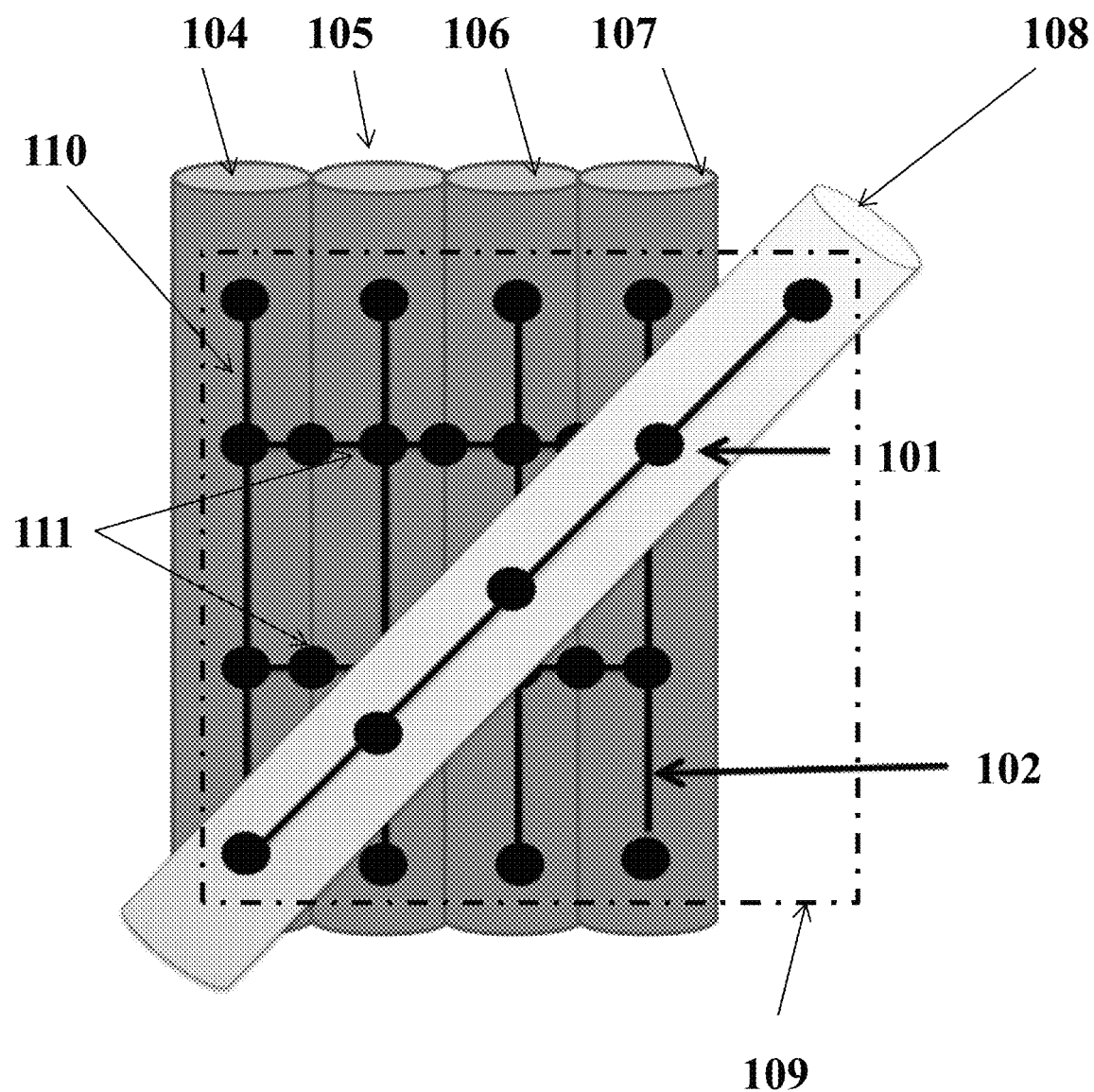
FIG. 2 illustrates where the filaments on the first layer (dark color) and the filaments in the top layer (light color) and bind sites between filaments in a single layer, and filaments between multiple layers create the physical lattice.

FIG. 2 shows a second example where the filaments 104-107 on the first layer were deposited side by side and therefore create long bind sites 110 along the length of the filaments 104-107 of the first layer. In this case, the FEA lattice 109 is created by subsampling this long bind site into a set of bind sites 111 along both filaments 104-107 and 108. This subsampling can be done for sufficiently large bind sites 101 whether the filaments run side by side or cross at an angle.

Although the figures show a particular transformation between the physical lattice 102 and the FEA lattice 109 other transformations that further subsample the physical lattice 102 or places the binding sites at different locations are possible.

In general, FEA algorithms can be decomposed into two types: 1) algorithms that discretize the space at regular intervals, and 2) algorithms that are provided a lattice 102 to simplify the process of discretization of the space.

For this system the Inventors are utilizing this second variant. In general, the advantages of this second approach are that the number of cells is significantly smaller, as they are purposely selected to take advantage of the inherent discretization of the properties of the system. In the system being described, the Inventors make explicit use of the repeatability of the bind sites 101 to extract this structure. Although many commercial CAD packages utilize FEA to extract the physical properties for the parts being designed, these approaches as significantly different from the system because, these CAD programs do not have access to the print trajectory and other printer specific parameters.

A designer designs a part to be 3D printed. The printer and material are selected and, therefore, the system is capable of recalling the properties of the bind sites 101 created by that particular AM process. The printer software then generates the print head trajectory that would generate the part at the particular fill rate. The bind sites 101 are extracted from the print head trajectory (or extracted from the print head path finding algorithm). The bind sites 101 together with information about filament directionality and properties of the print mechanisms (e.g. temperature, fill rate) are then used to automatically generate the FEA lattice 109. Using this lattice 102, the FEA algorithm can then predict the macro properties of the completed part. The system can be utilized to predict a variety of physical properties.

Mechanical properties: compressive strength, ductility, fatigue limit, flexural modulus, flexural strength, fracture toughness, hardness, plasticity, Poisson's ratio, resilience, shear modulus, shear strain, shear strength, specific modulus, specific strength, specific weight, tensile strength, yield strength, young's modulus, coefficient of friction, coefficient of restitution, roughness, etc.

Electromagnetic properties: dielectric constant, dielectric strength, electrical conductivity, permeability, permittivity, Seebeck coefficient, Curie point, diamagnetism, hysteresis, permeability, etc.

Acoustical properties: acoustic absorption, speed of sound, etc.

Thermal properties: autoignition temperature, binary phase diagram, boiling point, coefficient of thermal expansion, critical temperature, emissivity, eutectic point, flammability, flash point, glass transition temperature, heat of fusion, heat of vaporization, inversion temperature, melting point, phase diagram, pyrophoricity, solidus, specific heat, thermal conductivity, thermal diffusivity, triple point, vapor pressure, Vicat softening point, etc. and even optical and chemical properties can be predicted using this method.

The results of an FEA cycle can be used as a feedback loop to modify the printing parameters. For example, the FEA results of the predicted compression strength of the part can be used to optimize the print direction of the part. The FEA can be used to either iterate print directionalities or to utilize a Newton or Newton-Raphson search method to optimize one or more printing parameters.

The system is set to run on a computing device. A computing device on which the present invention can run would be comprised of a CPU, Hard Disk Drive, Keyboard, Monitor, CPU Main Memory and a portion of main memory where the system resides and executes. Any general-purpose computer with an appropriate amount of storage space is suitable for this purpose. Computer Devices like this are well known in the art and are not pertinent to the invention. The system 1 can also be written in a number of different languages and run on a number of different operating systems and platforms.

Although the present invention has been described in considerable detail with reference to certain preferred versions thereof, other versions are possible. Therefore, the point and scope of the appended claims should not be limited to the description of the preferred versions contained herein.

As to a further discussion of the manner of usage and operation of the present invention, the same should be apparent from the above description. Accordingly, no further discussion relating to the manner of usage and operation will be provided.

With respect to the above description, it is to be realized that the optimum dimensional relationships for the parts of the invention, to include variations in size, materials, shape, form, function and manner of operation, assembly and use, are deemed readily apparent and obvious to one skilled in the art, and all equivalent relationships to those illustrated in the drawings and described in the specification are intended to be encompassed by the present invention.

Therefore, the foregoing is considered as illustrative only of the principles of the invention. Further, since numerous modifications and changes will readily occur to those skilled in the art, it is not desired to limit the invention to the exact construction and operation shown and described, and accordingly, all suitable modifications and equivalents may be resorted to, falling within the scope of the invention.

The embodiments of the invention in which an exclusive property or privilege is claimed are defined as follows:

1. A method for the structural analysis for additive manufacturing by using non-transitory computer-readable medium capable of execution by a computer, mobile device, or other electronic device, the method comprising the following steps:
   providing on and executing computer-readable media by a computer machine for determining the bind sites and the connection and directionality of the threads of a physical lattice for creating a corresponding finite element analysis (FEA) lattice for simulation in order to determine the macro physical properties of an additive manufactured part being produced;
   providing a FEA software analysis cycle capable of predicting the physical properties of the additive manufactured part from the FEA lattice and providing 3D printing properties for an additive manufacturing process;
   conducting one or more finite element analysis (FEA) comprising the steps of; examining the physical lattice formed by the additive manufacturing process of 3D printing;
   determining the location of the binding sites in the physical lattice;
   creating a table or tables of binding properties and one or more printing parameters or providing method to compute them;
   transforming the binding properties of the physical lattice found in the table or tables of binding properties into a first finite element analysis (FEA) lattice;
   using the tabulated binding property values to determine FEA cell properties for the first FEA lattice;
   wherein the FEA lattice is the numerical representation of the physical lattice, including bind sites; and
   the micro properties of the bind site are encoded into explicit equations or neural networks; and
   predicting the physical properties of an additive manufactured part using a first FEA software analysis cycle.

2. The method of claim 1, wherein the one or more tables of binding properties are provided.

3. The method of claim 1, further comprising the steps of providing a method for calculating the binding properties; and
calculating the one or more tables of binding properties.

4. The method of claim 1, wherein the bind site properties are described by an explicit equation or numerical approximator instead of the table or tables of properties.

5. The method of claim 1, wherein different bind site properties are used for different materials.

6. The method of claim 1, further comprising the step of adding external forces to the first FEA lattice to the FEA software analysis cycle.

7. The method of claim 1, wherein the physical properties computed by the FEA include thermal and electromagnetic properties.

8. The method of claim 1, further comprising the step of simulating filament deformation in between bind sites using the FEA software analysis cycle.

9. The method of claim 1, further comprising the step of decomposing the filament between bind sites into multiple FEA cells in a lattice sub-sampling step.

10. The method of claim 1, further comprising the step of introducing sintering variables to the FEA software analysis cycle.

11. The method of claim 1, further comprising the steps of providing a loop using the results of the first FEA software analysis cycle as the starting point for a second FEA software analysis cycle to modify one or more printing parameters and modifying one or more printing parameters based on the results of the second or subsequent FEA software and analysis cycle.

12. The method of claim 1, wherein one of the printing parameters being adjusted is a predicted physical property of the fill rate of the part from the first FEA software analysis cycle.

13. The method of claim 1, wherein the FEA software analysis cycle is used in a loop resulting in a repeated analysis using the previous analysis to optimize the printing orientation to satisfy or optimize a particular physical property.

14. The method of claim 1, wherein one of the printing parameters being adjusted is a predicted physical annealing or sintering property.

15. The method of claim 1, further comprising the step of adding to the FEA lattice interaction with non-3D printed parts.

16. The method of claim 15, wherein the non-3D printed parts are screws and washers.

17. The method of claim 1, further comprising the step of predicting the physical properties of multiple materials within the same additive manufactured part using the FEA software analysis cycle.

18. The method of claim 1, further comprising the step of simulating multiple additive manufactured parts created by different physical lattices on a 3D printer.

* * * * *